United States Patent
Yates et al.

(10) Patent No.: US 10,914,790 B2
(45) Date of Patent: Feb. 9, 2021

(54) PERFORMANCE TESTS OF CAPACITORS

(71) Applicant: Hewlett Packard Enterprise Development LP, Houston, TX (US)

(72) Inventors: Kirk Yates, Atlanta, GA (US); Mohamed Amin Bemat, Cypress, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 377 days.

(21) Appl. No.: 15/881,031

(22) Filed: Jan. 26, 2018

(65) Prior Publication Data

US 2019/0235008 A1  Aug. 1, 2019

(51) Int. Cl.
  *G01R 31/02* (2006.01)
  *G01R 31/64* (2020.01)
  *G06F 1/26* (2006.01)
  *G04C 10/00* (2006.01)

(52) U.S. Cl.
  CPC .............. *G01R 31/64* (2020.01); *G04C 10/00* (2013.01); *G06F 1/26* (2013.01)

(58) Field of Classification Search
  CPC ............ G01R 31/64; G04C 10/00; G06F 1/26
  See application file for complete search history.

(56) References Cited

U.S. PATENT DOCUMENTS

| | | | | |
|---|---|---|---|---|
| 5,469,364 A | * | 11/1995 | Hughey | H03K 17/962 702/65 |
| 6,873,159 B2 | * | 3/2005 | Koch | G01R 27/2605 324/519 |
| 9,176,179 B2 | | 11/2015 | Hernon et al. | |
| 9,740,258 B2 | | 8/2017 | Morning-Smith et al. | |
| 2002/0130674 A1 | | 9/2002 | Lagowski et al. | |
| 2013/0268217 A1 | * | 10/2013 | Kim | G01R 31/64 702/58 |
| 2017/0179760 A1 | * | 6/2017 | Jawany | H02J 9/061 |
| 2017/0238108 A1 | | 8/2017 | Muza | |

OTHER PUBLICATIONS

"Testing of Capacitor Bank"; printed from https://www.electrical4u.com/testing-of-capacitor-bank/ on Oct. 16, 2017; 7 pages.

* cited by examiner

Primary Examiner — Son T Le
Assistant Examiner — Adam S Clarke
(74) Attorney, Agent, or Firm — Brooks, Cameron & Huebsch, PLLC

(57) ABSTRACT

Example implementations relate to performance tests of capacitors. In some examples, a controller may comprise a processing resource to measure a change in voltage of a capacitor of a circuit in response to the controller entering a test mode, determine, based on the measured change in the voltage and an impedance of the circuit, a capacitance of the capacitor, compare the determined capacitance of the capacitor to a predetermined capacitance value, and determine, based on the comparison, a performance of the capacitor.

20 Claims, 5 Drawing Sheets

PERFORMANCE TESTS OF CAPACITORS

BACKGROUND

A voltage regulator can provide a voltage to electrical components. For example, a voltage regulator can provide a voltage to various electrical components of a computing device.

A voltage regulator can include capacitors to provide the voltage to the various electrical components. The capacitors can be used to provide a stable voltage to the various electrical components.

DETAILED DESCRIPTION

Figure 1:
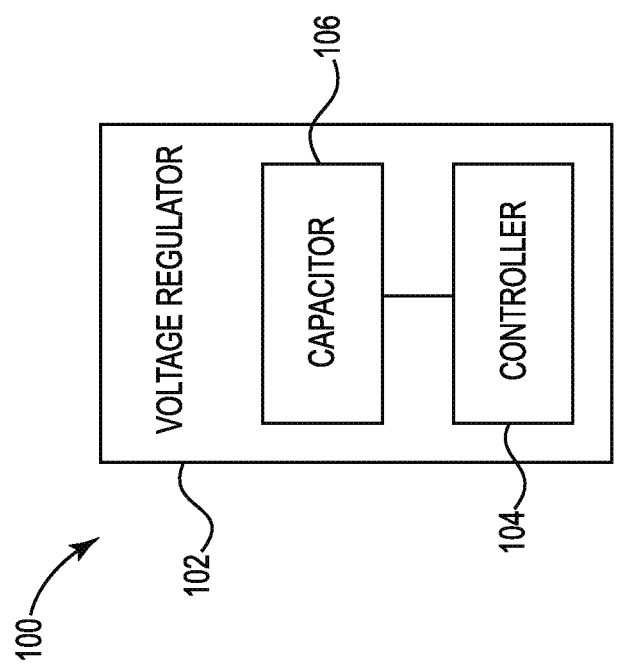
FIG. 1 illustrates an example of a system consistent with the disclosure.

A voltage regulator can provide stable voltages to electrical components of a computing device. As used herein, the term "voltage regulator" can, for example, refer to an electronic circuit that can provide a voltage to an electrical component independent of a load current to the voltage regulator. As used herein, the term "electronic circuit" can, for example, refer to individual electronic components connected by conductive wires or traces through which an electric current can flow. As used herein, the term "computing device" can, for example, refer to a laptop computer, a desktop computer, a server, storage and/or networking equipment, among other types of computing devices.

For example, a voltage regulator can provide a stable direct-current (DC) voltage to electrical components of a computing device, such as a processor, memory, graphics card, among other electrical components of a computing device. The voltage regulator may utilize electronic components such as capacitors to filter an output voltage provided to electrical components of a computing device. As used herein, the term "capacitor" can, for example, refer to an electrical component that stores electrical energy.

Capacitors utilized in a voltage regulator may include a specified capacitance value. The specified capacitance value can refer to a nominal capacitance value with a specified tolerance (e.g., nominal capacitance value±a specified tolerance value). In some instances, an actual capacitance value of the capacitor may be different from a specified capacitance value, which may be a result of a product and/or manufacturing defect with the capacitor. In some instances, the actual capacitance value may have changed over time as the capacitor ages. In some instances, the actual capacitance value may have changed over time as the capacitor is exposed to environmental conditions including thermal and/or other environmental stresses.

A capacitor with an actual capacitance value that is different than a specified capacitance value can result in failures of the voltage regulator's specification limits, which can cause failures of the computing device. Diagnosing a faulty capacitor can be difficult, since a failure can produce symptoms that are similar to a faulty load to the voltage regulator.

In some implementations, performance tests of capacitors can allow for a determination of a performance of a capacitor. A performance of the capacitor can refer to a comparison between a specified predetermined capacitance value and an actual capacitance value of the capacitor. Based on the comparison, a determination can be made as to whether the capacitor can be used in the voltage regulator. Performance tests of capacitors can allow for faulty capacitors to be detected prior to a computing device being sent to a customer, preventing time and energy having to be spent by, for instance, a field engineer to diagnose faults of the computing device. Further, performance tests of capacitors can allow for failure events occurring after a customer has received the computing device to be better understood, allowing for repairs to be done quickly and be less expensive.

FIG. 1 illustrates an example of a system 100 consistent with the disclosure. As illustrated in FIG. 1, the system 100 may include a voltage regulator 102, a controller 104, and a capacitor 106.

The system 100 may be included as a component of a computing device. For example, voltage regulator 102 and controller 104 can be a component of a computing device, such as a laptop computer, a desktop computer, a server, storage and/or networking equipment, among other types of computing devices.

As described above, voltage regulator 102 can supply a voltage to electronic components of a computing device. For example, although not illustrated in FIG. 1 for clarity and so as not to obscure examples of the disclosure, voltage regulator 102 can be connected to various electronic components of the computing device to provide a stable voltage to the components of the computing device, such as processors, memory, and/or graphics cards, among other examples.

Although controller 104 is illustrated in FIG. 1 as being internal to voltage regulator 102, examples of the disclosure are not so limited. For example, controller 104 can be included as a component external to voltage regulator 102.

Controller 104 can measure a change in voltage of capacitor 106 of a circuit in response to the controller 104 entering a test mode. As used herein, the term "voltage" can, for example, refer to an electric potential difference between two points per unit electric charge. As used herein, the term "test mode" can, for example, refer to a mode of operation of system 100 in which capacitance values of capacitor 106 can be tested.

Measuring a change in voltage of capacitor 106 can include measuring a time of change in voltage of capacitor 106. For example, a voltage of capacitor 106 may change over time from a first voltage to a second voltage. Measuring the change in voltage of capacitor 106 can include measuring a time of change from the first voltage to the second voltage.

In some examples, the first voltage may be higher than the second voltage. In other words, controller 104 can measure a time of change in voltage of capacitor 106 as capacitor 106 discharges, as is further described herein. As used herein, the term "discharge" can, for example, refer to a capacitor losing electrical charge, which can correspond to a decay in the voltage of the capacitor.

In some examples, the first voltage may be lower than the second voltage. In other words, controller 104 can measure a time of change in voltage of capacitor 106 as capacitor 106 charges, as is further described herein. As used herein, the term "charge" can, for example, refer to a capacitor gaining electrical charge, which can correspond to an increase in the voltage of the capacitor.

As is further described herein, controller 104 can determine the capacitance of the capacitor 106 based on the measured time of change in the voltage and an impedance of the circuit. As used herein, the term "impedance" can, for example, refer to a measure of opposition that a circuit presents to a current when a voltage is applied. For example, controller 104 can determine the capacitance of the capacitor 106 based on the impedance of the circuit, as well as the measured time of change in the voltage as the capacitor 106 charges and/or discharges, as is further described herein.

In some examples, controller 104 can determine, based on the measured change in the voltage and the impedance of the circuit, a capacitance of capacitor 106. For example, a change in voltage can occur as a result of a discharge of capacitor 106. Based on the measured time of change in voltage of capacitor 106 as a result of a discharge in the capacitance of capacitor 106, as well as a known impedance of the circuit, controller 104 can determine the capacitance of capacitor 106.

Measuring a time of discharge of capacitance of capacitor 106 can include measuring a quantity of clock cycles taken for the voltage of the capacitor 106 to decay from a first voltage to a second voltage. As used herein, the term "clock cycle" can, for example, refer to an amount of time between pulses of an oscillator of a processor.

The first voltage can be an intermediary voltage of capacitor 106. For example, the intermediary voltage can be the voltage at which capacitor 106 normally operates while providing a stable voltage to components of the computing device.

The second voltage can be an initial voltage. For example, the initial voltage can be a voltage level to which the voltage of the capacitor 106 decays to from the intermediary voltage. The capacitor 106 can decay from the intermediary voltage to the initial voltage based on the computing device including capacitor 106 powering off. That is, controller 104 can enter the test mode to test the capacitance of capacitor 106 in response to the computing device including capacitor 106 powering off.

For example, capacitance can be measured using Equation 1 below:

$$Tau = RC \qquad \text{Equation 1}$$

where Tau refers to a time constant, R refers to an impedance of the circuit measured in ohms, and C refers to a capacitance, measured in farads, of capacitor 106. The time constant Tau can be the time constant for the voltage of capacitor 106 to decay from the intermediary voltage (e.g., V(out)) to the initial voltage (e.g., 0.368*V(out)), where 0.368 is a constant voltage value that defines Tau.

Continuing with the example above, the intermediary voltage V(out) of capacitor 106 can be 1.8 volts (V). Controller 104 can measure the time of the voltage of capacitor 106 to decay from 1.8V to 0.368*1.8V to be 0.12 milliseconds (msec). Based on a known clock speed (e.g., 1 megahertz (MHz)), controller 104 can determine that it takes 120,000 clock cycles (e.g., the time constant) for the voltage of capacitor 106 to decay from 1.8V to 0.368*1.8V.

Controller 104 can utilize the determined clock cycles (e.g., 120,000) as well as Equation 2 below to determine capacitance:

$$C = Tau/R \qquad \text{Equation 2}$$

where Tau refers to the time constant Tau, R refers to the impedance of the circuit, and C refers to the capacitance.

Controller 104 can determine the capacitance of capacitor 106 using the impedance of the circuit and the measured quantity of clock cycles. That is, using a measured 50 ohm impedance to ground of the circuit (e.g., R=50 ohms), controller 104 can determine the capacitance of capacitor 106 to be 2400 microfarads (e.g., μF).

Although described above as using a 1 MHz clock frequency, examples of the disclosure are not so limited. Since Tau is dependent on a system's capacitor design, the chosen clock frequency should be greater than 100*(1/Tau) for a more reliable measurement accuracy than would be provided if the chosen clock frequency was 10*(1/Tau), since 10*(1/Tau) may not be within an allowable design tolerance. In other words, the clock speed can be any other clock speed and can be chosen to account for desired measurement accuracy. For example, the clock speed can be any other clock speed (e.g., 100 kilohertz (kHz)).

As described above, the initial voltage (e.g., 0.368*V (out)) is not zero. That is, controller 104 can measure the decay from V(out) to 0.368*V(out).

In some examples, controller 104 can determine, based on the measured change in the voltage and the impedance of the circuit, a capacitance of capacitor 106. For example, a change in voltage can occur as a result of a charge of capacitor 106. Based on the measured time of change in voltage of capacitor 106 as a result of a charge in the capacitance of capacitor 106, as well as a known current, controller 104 can determine the capacitance of capacitor 106.

Similar to the measuring the time of discharge, measuring the time of charge of the capacitance of capacitor 106 can include measuring a quantity of clock cycles taken for the voltage of capacitor 106 to increase from a first voltage to a second voltage. The first voltage can be an initial voltage such as 0 V, and the second voltage can be an intermediary voltage. The intermediary voltage can be the voltage at which capacitor 106 normally operates while providing a stable voltage to components of the computing device. The capacitor 106 can increase from the initial voltage to the intermediary voltage based on the computing device including capacitor 106 powering on. That is, controller 104 can enter the test mode to test the capacitance of capacitor 106 in response to the computing device including capacitor 106 powering on.

Controller 104 can measure the time of the voltage of capacitor 106 to increase from the first voltage (e.g., 0V to 0.63*V(in), where V(in) can be 1.8V. For example, the time of the voltage to increase from the first voltage to the second voltage can be 10 ms with a 50 Ohm predetermined charge resistance.

Controller 104 can determine the capacitance of capacitor 106 using the impedance of the circuit, the time of charge, and the predetermined input current. For example, utilizing the time of charge of 10 ms and the predetermined input current of 1 amp, the capacitance of capacitor 106 can be determined to be 2400 μF.

Although controller 104 is described above as determining the capacitance of capacitor 106 to be 2400 μF, examples of the disclosure are not so limited. For example, the capacitance of capacitor 106 can be determined to be higher or lower than 2400 μF, or any other value of capacitance for capacitor 106.

Controller 104 can compare the determined capacitance of capacitor 106 to a predetermined capacitance value. For example, as described above, controller 104 can determine the actual capacitance value of capacitor 106 to be 2400 µF. The 2400 µF determined capacitance value of capacitor 106 can be compared to a predetermined capacitance value. In some examples, the predetermined capacitance value can be a designed capacitance from a manufacturer of capacitor 106. In some examples, the predetermined capacitance value can be a lowest allowable capacitance value that would allow proper function of voltage regulator 102.

In some examples, the predetermined capacitance value can be stored locally on controller 104. However, examples of the disclosure are not so limited. For example, the predetermined capacitance value can be stored remotely from controller 104 (e.g., on a remote computing device).

Controller 104 can determine, based on the comparison of the determined capacitance of capacitor 106 to the predetermined capacitance value, a performance of the capacitor 106. The performance of the capacitor 106 can be determined based on whether the determined capacitance is higher or lower than the predetermined capacitance value.

For example, the 2400 µF determined capacitance value can be compared to a designed capacitance from the manufacturer of capacitor 106. If, for instance, the designed capacitance value from the manufacturer is 2400 µF, controller 104 can determine that capacitor 106 has passed the performance test. If, on the other hand, the designed capacitance value from the manufacturer is 2500 µF, controller 104 can determine capacitor 106 has failed the performance test in response to the determined capacitance value being less than the designed capacitance value.

Although the determined capacitance value is described as being the same or below the designed capacitance value, examples of the disclosure are not so limited. For example, the determined capacitance value may be above the designed capacitance value, resulting in capacitor 106 passing the performance test. In some examples, the determined capacitance may be compared to the designed capacitance value, and in response to the determined capacitance being within a threshold capacitance value of the designed capacitance value, be deemed to have passed the performance test; conversely, if the determined capacitance is outside the threshold capacitance value of the designed capacitance value, capacitor 106 can be deemed to have failed the performance test.

As another example, the 2400 µF determined capacitance value can be compared to a lowest allowable capacitance value. If, for instance, the lowest allowable capacitance value 2200 µF, controller 104 can determine that capacitor 106 has passed the performance test as a result of the determined capacitance being higher than the lowest allowable capacitance value. If, on the other hand, the lowest allowable capacitance value is 2500 µF, controller 104 can determine capacitor 106 has failed the performance test in response to the determined capacitance value being lower than the lowest allowable capacitance value.

Controller 104 can generate an alert in response to capacitor 106 having failed the performance test. For example, the controller 104 can cause an alert to be generated and sent to a user. In some examples, the alert may be displayed on a display of the computing device including the voltage regulator 102 having the failed capacitor 106. In some examples, the alert may be sent to a mobile device of a user. As used herein, the term "mobile device" can, for example, refer to a device that can be carried and/or worn by a user, including a phone (e.g., a smart phone), a tablet, a personal digital assistant (PDA), smart glasses, and/or a wrist-worn device (e.g., a smart watch), among other types of mobile devices.

In some examples, the alert can be used to describe to a customer of the computing device having the failed capacitor 106 that a fix to the computing device may occur at the next servicing event of the computing device. For example, the alert can describe that a field engineer or other technician may repair or replace a portion of the computing device including the failed capacitor 106 at a next servicing event of the computing device.

Performance tests of capacitors, according to the disclosure, can allow for self-tests of capacitance values of capacitors included in the computing device. Capacitance values can be checked prior to the computing device being shipped to customer, allowing for increased quality checks and preventing customer dissatisfaction. Further, performance tests of capacitors can allow a field engineer or other technician to more easily determine computing device faults that may be the result of a faulty capacitor.

Figure 2:
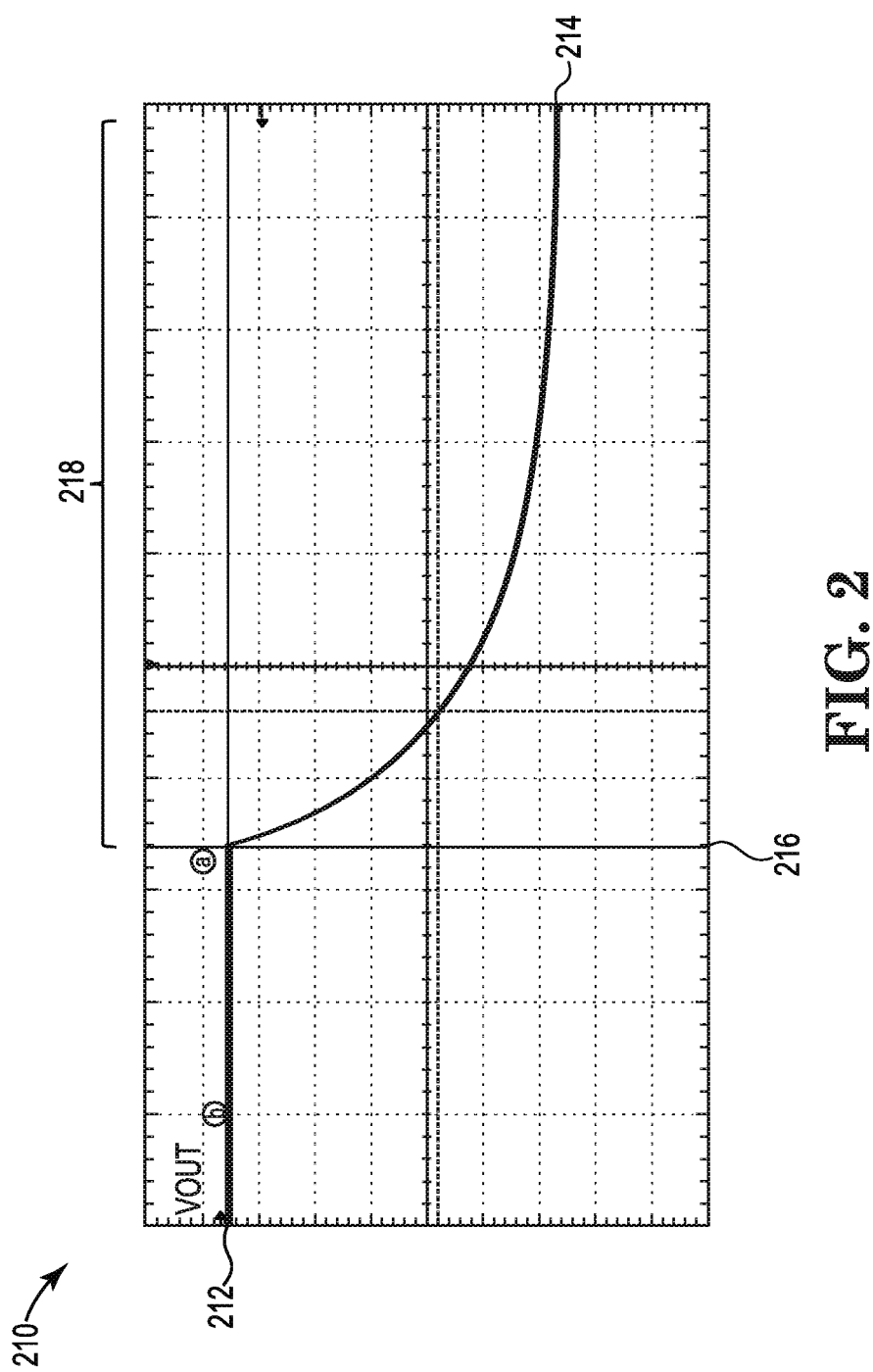
FIG. 2 is an example graph of voltage decay of a capacitor consistent with the disclosure.

FIG. 2 is an example graph 210 of voltage decay of a capacitor consistent with the disclosure. As illustrated in FIG. 2, graph 210 of the voltage decay of a capacitor may include an intermediary voltage 212, an initial voltage 214, initiation of test mode 216, and voltage decay 218.

As shown in FIG. 2, graph 210 can be a graph of the voltage of a capacitor. Intermediary voltage 212 can correspond to the voltage at which the capacitor is operating to provide a stable voltage to the components of the computing device, such as processors, memory, and/or graphics cards, among other examples.

As previously described in connection with FIG. 1, a controller can be used to test the capacitance of the capacitor. For example, the controller can initiate a test mode in order to test the capacitance of the capacitor.

Initiation of the test mode 216 is shown in FIG. 2. At initiation of the test mode 216, the voltage of the capacitor begins to change. The change in the voltage can occur as a result of a discharge of the capacitance of the capacitor. The voltage can decay from intermediary voltage 212 to initial voltage 214, illustrated in FIG. 2 as voltage decay 218.

As previously described in connection with FIG. 1, the controller can measure a time of the discharge of the capacitance of the capacitor by measuring a quantity of clock cycles taken between the changes in voltage. For example, the controller can measure a quantity of clock cycles taken for the voltage of the capacitor to decay from intermediary voltage 212 to initial voltage 214. Using the measured quantity of clock cycles and a known impedance of the circuit, the controller can determine the capacitance of the capacitor.

Figure 3:
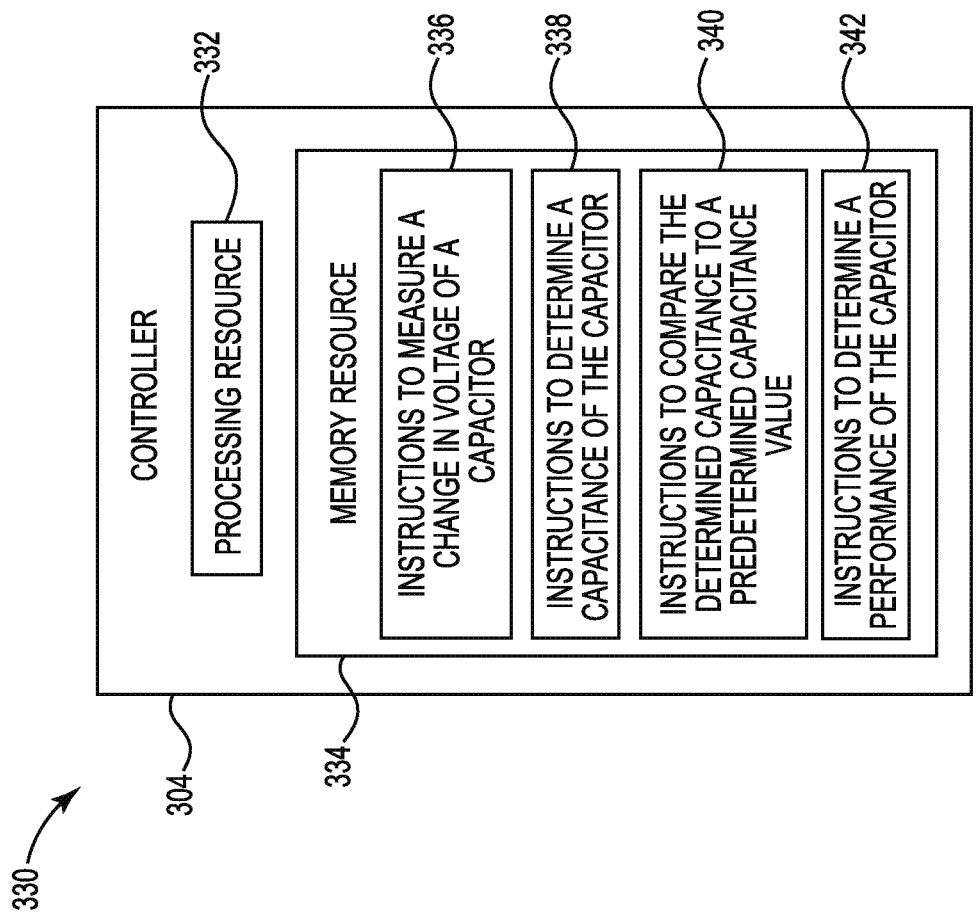
FIG. 3 is a diagram of an example of a controller to test performance of capacitors consistent with the disclosure.

FIG. 3 is a diagram 330 of an example of a controller 304 to test performance of capacitors consistent with the disclosure. As described herein, the controller 304 (e.g., controller 104, described in connection with FIG. 1) may perform a function related to performance tests of capacitors. Although not illustrated in FIG. 3, the controller 304 may include a machine-readable storage medium. Although the following descriptions refer to an individual processing resource and an individual machine-readable storage medium, the descriptions may also apply to a system with multiple processing resources and multiple machine-readable storage mediums. In such examples, the controller 304 may be distributed across multiple machine-readable storage mediums and the controller 304 may be distributed across multiple processing resources. Put another way, the instructions executed by the controller 304 may be stored across multiple machine-readable storage mediums and executed across multiple processing resources, such as in a distributed or virtual computing environment.

As illustrated in FIG. 3, the controller 304 may comprise a processing resource 332, and a memory resource 334 storing machine-readable instructions to cause the processing resource 332 to perform an operation relating to performance tests of capacitors. That is, using the processing resource 332 and the memory resource 334, the controller 304 may determine a performance of a capacitor, among other operations. Processing resource 332 may be a central processing unit (CPU), microprocessor, and/or other hardware device suitable for retrieval and execution of instructions stored in memory resource 334.

The controller 304 may include instructions 336 stored in the memory resource 334 and executable by the processing resource 332 to measure a change in voltage of a capacitor. For example, controller 304 may include instructions 336 stored in the memory resource 334 and executable by the processing resource 332 to measure a change in voltage of the capacitor of a circuit in response to controller 304 entering a test mode. Measuring a change in voltage of the capacitor can include measuring a time of the change in voltage of the capacitor. In some examples, the change in voltage can occur as a result of a discharge of the capacitance of the capacitor. In some examples the change in voltage can occur as a result of a charging of the capacitance of the capacitor.

The controller 304 may include instructions 338 stored in the memory resource 334 and executable by the processing resource 332 to determine a capacitance of the capacitor. For example, controller 304 may include instructions 338 stored in the memory resource 334 and executable by the processing resource 332 to determine, based on the measured change in the voltage and an impedance of the circuit, a capacitance of the capacitor.

The controller 304 may include instructions 340 stored in the memory resource 334 and executable by the processing resource 332 to compare the determined capacitance to a predetermined capacitance value. In some examples, the predetermined capacitance value can be a designed capacitance from a manufacturer of the capacitor. In some examples, the predetermined capacitance value can be a lowest allowable capacitance value that would allow for proper function of the voltage regulator.

The controller 304 may include instructions 342 stored in the memory resource 334 and executable by the processing resource 332 to determine a performance of the capacitor. For example, controller 304 may include instructions 342 stored in the memory resource 334 and executable by the processing resource 332 to determine, based on the comparison, a performance of the capacitor. For example, the controller 304 can compare the determined capacitance to the predetermined capacitance. The controller 304 can determine that the capacitor has passed the performance test in response to the determined capacitance being above the predetermined capacitance value. The controller 304 can determine that the capacitor has failed the performance test in response to the determined capacitance being below the predetermined capacitance value.

Figure 4:
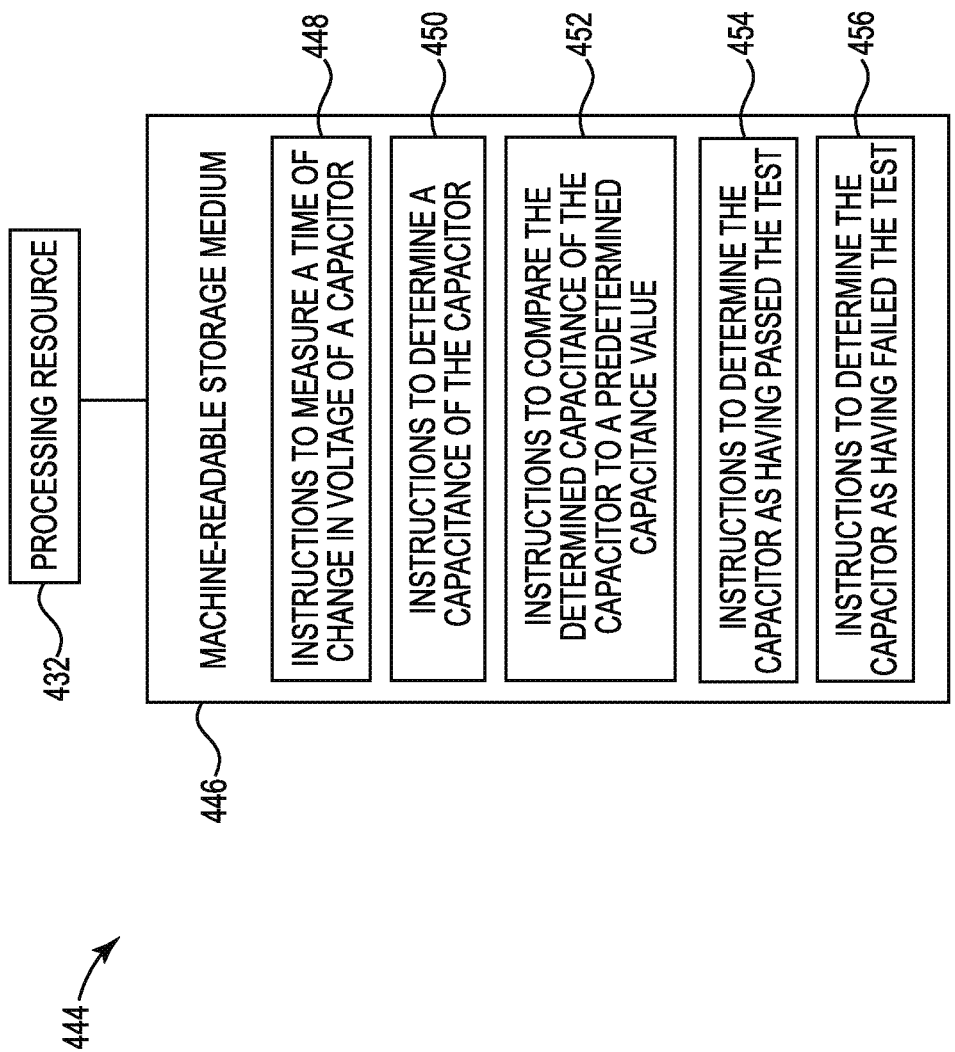
FIG. 4 is a block diagram of an example system to test performance of capacitors consistent with the disclosure.

FIG. 4 is a block diagram of an example system 444 to test performance of capacitors consistent with the disclosure. In the example of FIG. 4, system 444 includes a processing resource 432 (e.g., processing resource 332, described in connection with FIG. 3) and a machine-readable storage medium 446. Although the following descriptions refer to an individual processing resource and an individual machine-readable storage medium, the descriptions may also apply to a system with multiple processing resources and multiple machine-readable storage mediums. In such examples, the instructions may be distributed across multiple machine-readable storage mediums and the instructions may be distributed across multiple processing resources. Put another way, the instructions may be stored across multiple machine-readable storage mediums and executed across multiple processing resources, such as in a distributed computing environment.

Processing resource 432 may be a central processing unit (CPU), microprocessor, and/or other hardware device suitable for retrieval and execution of instructions stored in machine-readable storage medium 446. In the particular example shown in FIG. 4, processing resource 432 may receive, determine, and send instructions 448, 450, 452, 454, 456. As an alternative or in addition to retrieving and executing instructions, processing resource 432 may include an electronic circuit comprising an electronic component for performing the operations of the instructions in machine-readable storage medium 446. With respect to the executable instruction representations or boxes described and shown herein, it should be understood that part or all of the executable instructions and/or electronic circuits included within one box may be included in a different box shown in the figures or in a different box not shown.

Machine-readable storage medium 446 may be any electronic, magnetic, optical, or other physical storage device that stores executable instructions. Thus, machine-readable storage medium 446 may be, for example, Random Access Memory (RAM), an Electrically-Erasable Programmable Read-Only Memory (EEPROM), a storage drive, an optical disc, and the like. The executable instructions may be "installed" on the system 444 illustrated in FIG. 4. Machine-readable storage medium 446 may be a portable, external or remote storage medium, for example, that allows the system 444 to download the instructions from the portable/external/remote storage medium. In this situation, the executable instructions may be part of an "installation package". As described herein, machine-readable storage medium 446 may be encoded with executable instructions related to determining computing device information.

Instructions 448 to measure a time of change in voltage of a capacitor, when executed by processing resource 432, may cause system 444 to measure a time of change in voltage of a capacitor of a circuit in response to the controller entering a capacitance test mode. In some examples, the time of change in voltage of the capacitor can be a time of change of decay of voltage from a first voltage of the capacitor to a second voltage of the capacitor. In some examples, the time of change in voltage of the capacitor can be a time of change of charge of voltage from a first voltage of the capacitor to a second voltage of the capacitor.

Instructions 450 to determine a capacitance of the capacitor, when executed by processing resource 432, may cause system 444 to determine, based on the measured time of change in the voltage and an impedance of the circuit, a capacitance of the capacitor.

Instructions 452 to compare the determined capacitance of the capacitor to a predetermined capacitance value, when executed by processing resource 432, may cause system 444 to compare the determined capacitance of the capacitor to a predetermined capacitance value. The predetermined capacitance value can be a lowest allowable capacitance value that would allow proper function of the voltage regulator.

Instructions 454 to determine the capacitor as having passed the test, when executed by processing resource 432, may cause system 444 to determine, in response to the determined capacitance being above the predetermined capacitance value, the capacitor as having passed the test.

Instructions 456 to determine the capacitor as having failed the test, when executed by processing resource 432, may cause system 444 to determine, in response to the determined capacitance being below the predetermined capacitance value, the capacitor as having failed the test.

Figure 5:
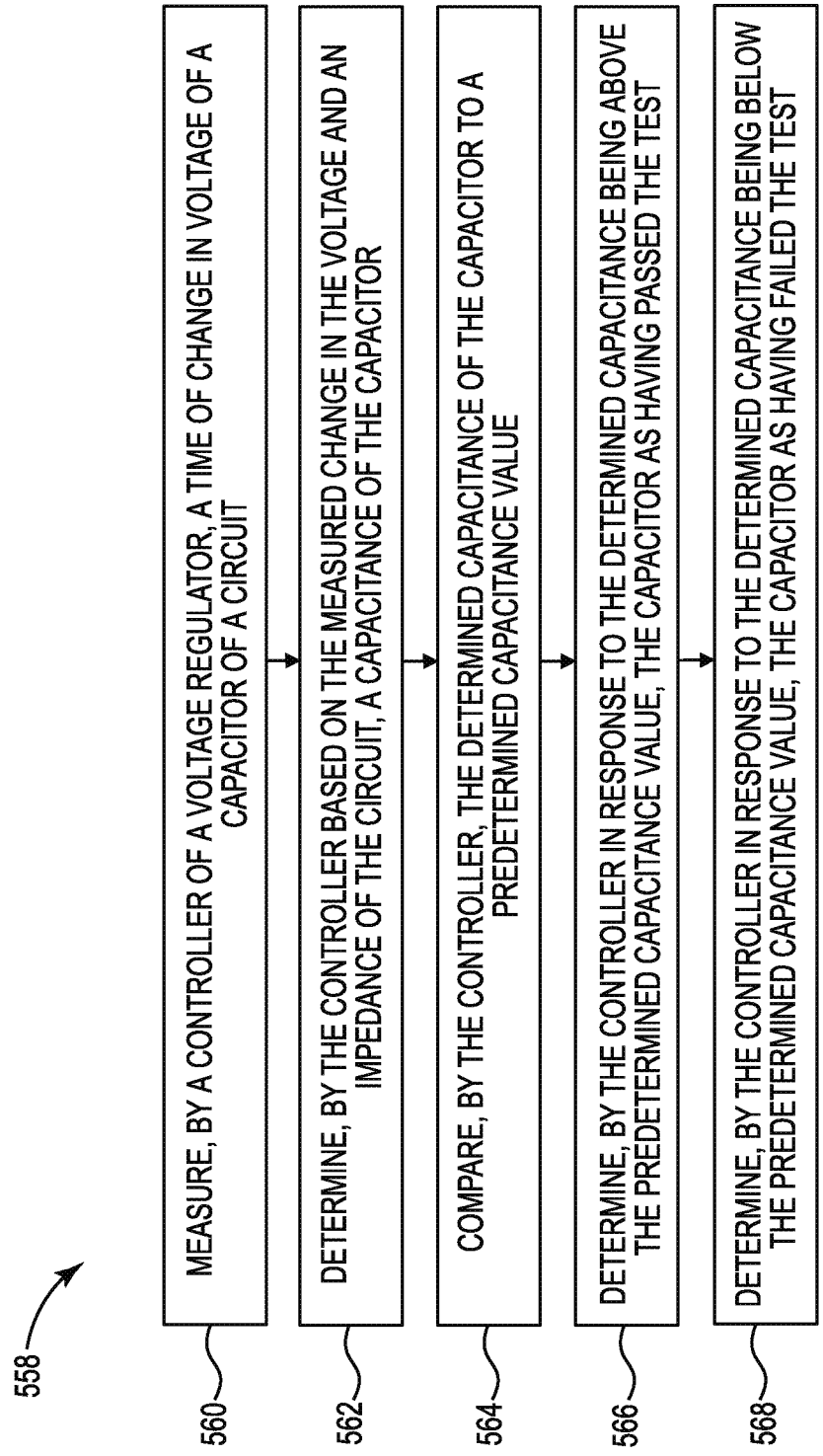
FIG. 5 illustrates an example of a method consistent with the disclosure.

FIG. 5 illustrates an example of a method 558 consistent with the disclosure. Method 558 may be performed by a controller (e.g., controller 104, 304, described in connection with FIGS. 1 and 3, respectively).

At 560, the method 558 may include measuring, by a controller of a voltage regulator, a time of change in voltage of a capacitor of a circuit. The controller can measure the time of change in voltage of the capacitor in response to the controller entering a capacitance test mode. Measuring the change in voltage of the capacitor can include measuring a time of the change in voltage of the capacitor. In some examples, the voltage change of the capacitor can occur as a result of the capacitor discharging. In some examples, the voltage change of the capacitor can occur as a result of the capacitor charging.

At 562, the method 558 can include determining, by the controller based on the measured change in the voltage and an impedance of the circuit, a capacitance of the capacitor. The controller can utilize the impedance of the circuit, as well as an amount of clock cycles between the measured change in the voltage of the capacitor to determine the capacitance of the capacitor.

At 564, the method 558 can include comparing, by the controller, the determined capacitance of the capacitor to a predetermined capacitance value. The predetermined capacitance value can be a designed capacitance from a manufacturer of the capacitor or a lowest allowable capacitance value that would allow for proper function of the voltage regulator.

At 566, the method 558 can include determining, by the controller in response to the determined capacitance being above the predetermined capacitance value, the capacitor as having passed the test. For example, the controller can compare the determined capacitance to the predetermined capacitance. The controller can determine that the capacitor has passed the performance test in response to the determined capacitance being above the predetermined capacitance value.

At 568, the method 558 can include determining, by the controller in response to the determined capacitance being below the predetermined capacitance value, the capacitor as having failed the test. For example, the controller can compare the determined capacitance to the predetermined capacitance. The controller can determine that the capacitor has failed the performance test in response to the determined capacitance being below the predetermined capacitance value.

Method 558 may include changing, in response to the capacitor having failed the test, controller parameters to enable the voltage regulator to function correctly with the capacitor that failed the test. For instance, the controller may change the input current to the voltage regulator to allow the voltage regulator to properly function under the lesser capacitance value of the capacitor that failed the performance test. Changing controller parameters can allow a voltage regulator to continue to function under a capacitor with a lesser capacitance in order to prevent downtime of the computing device. A customer may still be able to use the computing device with the lesser capacitance value capacitor until a field engineer or other technician can service the computing device.

Method 558 may include generating, in response to the capacitor having failed the test, an alert. For example, the controller can cause an alert to be generated and sent to a user. In some examples, the alert may be displayed on a display of the computing device including the voltage regulator having the failed capacitor. In some examples, the alert may be sent to a mobile device of a user. In some examples, the alert can be used to describe to a customer of the computing device having the failed capacitor that a fix to the computing device may occur at the next servicing event of the computing device. For example, the alert can describe that a field engineer or other technician may repair or replace a portion of the computing device including the failed capacitor at a next servicing event of the computing device.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure.

The figures herein follow a numbering convention in which the first digit corresponds to the drawing figure number and the remaining digits identify an element or component in the drawing. Similar elements or components between different figures may be identified by the use of similar digits. For example, 104 may reference element "04" in FIG. 1, and a similar element may be referenced as 304 in FIG. 3. Elements shown in the various figures herein can be added, exchanged, and/or eliminated so as to provide a plurality of additional examples of the disclosure. In addition, the proportion and the relative scale of the elements provided in the figures are intended to illustrate the examples of the disclosure, and should not be taken in a limiting sense. As used herein, "a plurality of" an element and/or feature can refer to more than one of such elements and/or features.

What is claimed:

1. A controller, comprising:
   a processing resource; and
   a memory resource storing machine-readable instructions to cause the processing resource to:
   detect when the controller enters a test mode that charges or discharges a capacitor from a first voltage to at least a predetermined second voltage;
   count cycles of a clock while measuring a voltage of the capacitor during the charge or discharge;
   when the capacitor reaches the predetermined second voltage, derive the time of change in the voltage from the counted cycles of the clock;
   determine, based on the time of change in the voltage and a known impedance of a circuit coupled to the capacitor, a capacitance of the capacitor;
   compare the determined capacitance of the capacitor to a predetermined capacitance value; and
   determine, based on the comparison, a performance of the capacitor.

2. The controller of claim 1, wherein the test mode comprises a discharge of the capacitor.

3. The controller of claim 2, wherein the instructions are executed by the processor to measure a voltage decay from the first voltage to the predetermined second voltage as a result of the discharge of the capacitor.

4. The controller of claim 1, wherein the test mode comprises a charge of the capacitor.

5. The controller of claim 1, wherein the capacitor is built into a computing device, and wherein the controller enters the test mode during a powering-off process of the computing device.

6. The controller of claim 1, wherein the capacitor is built into a computing device, and wherein the controller enters the test mode during a powering-on process of the computing device.

7. The controller of claim 1, wherein the controller is internal to a voltage regulator.

8. The controller of claim 1, wherein the controller is external to a voltage regulator.

9. A non-transitory machine-readable storage medium having stored thereon machine-readable instructions to cause a computer processor to:
   begin counting clock cycles while monitoring a voltage of a capacitor when a controller, entering a test mode, begins charging or discharging the capacitor from a first voltage;
   capture the number of counted clock cycles when the capacitor reaches a predetermined second voltage;
   derive a time of change in voltage of the capacitor from the number of counted clock cycles;
   determine, based on the time of change in the voltage and a known impedance of a circuit coupled to the capacitor, a capacitance of the capacitor;
   compare the determined capacitance of the capacitor to a predetermined capacitance value;
   determine, in response to the determined capacitance being above the predetermined capacitance value, the capacitor as having passed the test; and
   determine, in response to the determined capacitance being below the predetermined capacitance value, the capacitor as having failed the test.

10. The medium of claim 9, wherein the instructions comprise instructions to measure a time of discharge of the capacitor.

11. The medium of claim 9, wherein the instructions further comprise instructions to measure a time of charge of the capacitor after applying a predetermined input current.

12. The medium of claim 11, further comprising instructions to determine the capacitance of the capacitor using the impedance of the circuit, the time of charge, and the predetermined input current.

13. The medium of claim 9, wherein the predetermined second voltage is 0.368 times a voltage at which the capacitor normally operates.

14. The medium of claim 9, wherein the predetermined second voltage is 0.63 times a voltage at which the capacitor normally operates.

15. The medium of claim 9, wherein a frequency of the clock cycles is greater than 100*(1/Tau), wherein Tau equals the known impedance multiplied by the predetermined capacitance value.

16. A method, comprising:
   causing a controller of a voltage regulator to enter a capacitance test mode that charges or discharges a capacitor from a first voltage to at least a predetermined second voltage;
   measuring, by the controller, a time of change in voltage of the capacitor when the capacitor reaches the predetermined second voltage;
   determining, by the controller, based on the measured time of change in the voltage and a known impedance of a circuit coupled to the capacitor, a capacitance of the capacitor;
   comparing, by the controller, the determined capacitance of the capacitor to a predetermined capacitance value;
   determining, by the controller, in response to the determined capacitance being within a specified tolerance of the predetermined capacitance value, the capacitor as having passed the test; and
   determining, by the controller in response to the determined capacitance being outside the specified tolerance of the predetermined capacitance value, the capacitor as having failed the test.

17. The method of claim 16, wherein the method further includes changing, in response to the capacitor having failed the test, controller parameters to enable the voltage regulator to function correctly with the capacitor that failed the test.

18. The method of claim 17, wherein the controller parameters include an input current.

19. The method of claim 16, wherein the method further includes generating, in response to the capacitor having failed the test, an alert.

20. The method of claim 16, wherein the specified tolerance of the predetermined capacitance value is nonzero for higher values of the determined capacitance and zero for lower values of the determined capacitance.

* * * * *